United States Patent [19]
Niikura et al.

[11] Patent Number: 5,518,860
[45] Date of Patent: May 21, 1996

[54] POSITIVE-WORKING QUINONEDIAZIDE PHOTORESIST COMPOSITION CONTAINING HYDROXYALKYL SUBSTITUTED PYRIDINE COMPOUND

[75] Inventors: Satoshi Niikura; Jun Koshiyama; Tetsuya Kato; Kouichi Takahashi; Hidekatsu Kohara; Toshimasa Nakayama, all of Kanagawa, Japan

[73] Assignee: Tokyo Ohka Kogyo Co., Ltd., Japan

[21] Appl. No.: 463,887

[22] Filed: Jun. 5, 1995

[30]  Foreign Application Priority Data

Jun. 8, 1994  [JP]  Japan ..................... 6-126372

[51] Int. Cl.$^6$ .............................. G03F 7/023; G03C 1/61
[52] U.S. Cl. ......................................... 430/191; 430/192
[58] Field of Search ................................ 430/190, 191, 430/192, 193

[56]  References Cited

U.S. PATENT DOCUMENTS 3,622,334  11/1971  Matawan et al. .

FOREIGN PATENT DOCUMENTS

0459395A2  12/1991  European Pat. Off. .
2-132442     5/1990  Japan .
6-27657      2/1994  Japan .

*Primary Examiner*—Charles L. Bowers, Jr.
*Assistant Examiner*—Christopher G. Young
*Attorney, Agent, or Firm*—Wenderoth, Lind & Ponack

[57]  ABSTRACT

A positive-working photoresist composition comprising a cresol novolac resin as the film-forming agent and a quinonediazido group-containing compound as the photosensitizing agent is admixed with a limited amount of a hydroxyalkyl-substituted pyridine compound so that great improvements can be obtained in the adhesive bonding of the resist layer to the substrate surface and in the stability of the composition by storage still without the problem due to the sublimed material from the resist layer during the patterning process.

5 Claims, No Drawings

POSITIVE-WORKING QUINONEDIAZIDE PHOTORESIST COMPOSITION CONTAINING HYDROXYALKYL SUBSTITUTED PYRIDINE COMPOUND

BACKGROUND OF THE INVENTION

The present invention relates to a positive-working photoresist composition or, more particularly, to a positive-working photoresist composition which is capable of giving a patterned resist layer exhibiting excellent adhesion to the substrate surface with a surface film of silicon oxide or silicon nitride without suffering the troubles of incomplete or disordered etching in the subsequent steps in the manufacture of various kinds of electronic devices such as semiconductor devices, TFTs (thin-film transistors), liquid-crystal display panels and the like and which is very stable in connection with the photosensitivity in the pattern-wise exposure to actinic rays and film-thickness retention in the development treatment in the lapse of long time for storage.

As is known, the photolithographic patterning work to form a patterned resist layer on the substrate surface is a well established technology in the manufacturing process of various kinds of electronic devices such as semiconductor devices, TFTs, liquid-crystal display panels and the like, in which the substrate surface is provided with a coating layer of a photoresist composition which is exposed pattern-wise to actinic rays through a patterned photomask to form a latent image of the pattern followed by a development treatment of the latent image to form a patterned resist layer which serves as a protective resist in the subsequent processing such as etching. It is sometimes the case that the surface of the substrate, such as a semiconductor silicon wafer, is provided with a surface film of silicon oxide or silicon nitride or the substrate per se is made from a metallic material such as aluminum, tantalum, molybdenum, chromium and the like.

Of the two types of the photoresist compositions including the positive-working and negative-working ones, the photoresist compositions of the former type are preferred to the latter type in most applications. Typically, a positive-working photoresist composition is formulated with an alkali-soluble resinous ingredient such as novolac resins as a film-forming agent and a quinonediazido group-containing compound or, in particular, a quinonediazido group-containing benzophenone compound as a photosensitizing agent (see, for example, U.S. Pat. No. 4,377,631 and Japanese Patent Kokai No. 62-35349, No. 1-142548 and No. 1-179147).

One of the important requirements in the photolithographic patterning work is firm adhesive bonding between the substrate surface and the patterned resist layer, especially, when the surface of the substrate, such as a semiconductor silicon wafer, is provided with a surface film of silicon oxide or silicon nitride or the substrate per se is made from a metallic material such as aluminum, tantalum, molybdenum, chromium and the like in the manufacture of semiconductor devices, TFTs and the like.

In this regard, various proposals and attempts have been made heretofore to improve the performance of the photoresist compositions. For example, U.S. Pat. No. 3,622,334 discloses that the adhesive bonding strength can be enhanced between a metallic substrate surface and a resist layer formed thereon from a negative-working photoresist composition by the admixture of the photoresist composition with benzimidazole. Japanese Patent Kokai No. 4-46345, on the other hand, discloses a positive-working photoresist composition capable of exhibiting improved adhesion to the surface of a semiconductor silicon substrate by formulating the composition by the admixture of a polymeric resinous ingredient consisting of a polybenzimidazole and having solubility in an organic solvent and a photosensitive diazoquinone compound to a precursor of polybenzoxazole. No successful proposals had been made, however, for the improvement of the adhesive bonding between a substrate surface and a resist layer of a positive-working photoresist composition comprising an alkali-soluble novolac resin as the film-forming agent.

The inventors in Japanese Patent Kokai 6-27657 have previously proposed a positive-working photoresist composition by the admixture of a (poly)benzimidazole compound to a base composition comprising an alkali-soluble novolac resin and a quinonediazido group-containing compound with an object to improve the adhesive bonding between the resist layer and the substrate surface. Although the adhesive bonding can be improved to some extent, however, this photoresist composition has another serious problem that, due to the sublimability of the (poly)benzimidazole compound, sublimation of the additive compound takes place in the course of the post-baking treatment after development to deposit crystalline particles on the inner walls of the treatment chamber which subsequently fall on the work piece in the treatment chamber greatly affecting the subsequent etching treatment of the substrate having the patterned resist layer. Further, Japanese Patent Kokai 2-132442 discloses a positive-working photoresist composition comprising, in addition to an alkali-soluble phenol novolac resin and a photosensitizing agent, an amine compound such as N,N-dialkylaniline compounds by which an improvement can be accomplished for the problem that very fine particles are produced in the resist composition during storage adversely affecting the resolution in the fine patterning of the resist layer.

While it is a current practice in the photolithographic technology using a photoresist composition in consideration of cost saving in the manufacturing process that a volume of the developer solution is used under circulation in a development machine, the developer solution worn out is replaced with a fresh volume of the developer solution less frequently than heretofore. In such a development procedure with prolonged circulation of the developer solution, the effective photo-sensitivity of the photoresist layer is subject to gradual decrease from that with a fresh volume of the developer solution as the developing power of the developer solution is degraded in the lapse of time for the circulation use so that patterning of the resist layer cannot be uniform enough in the accuracy throughout the development work using a volume of the developer solution. This problem due to the circulation use of the developer solution is not limited to the effective photosensitivity of the resist composition alone but the film thickness retention is also affected. Even apart from these problems, photoresist compositions are strongly required to have high stability in the lapse of time after preparation relative to the photosensitivity and film thickness retention.

SUMMARY OF THE INVENTION

The present invention accordingly has an object to provide a novel positive-working photoresist composition suitable for use in the photolithographic patterning works in the manufacture of semiconductor devices and liquid crystal devices and capable of exhibiting excellent adhesive bonding strength between the resist layer and the surface of a substrate having a surface layer of oxidized silicon or silicon nitride without the problems due to the sublimates in the post-baking treatment and gradual degradation in the lapse of time relative to the photosensitivity and film thickness retention.

Thus, the positive-working photoresist composition provided by the invention is a uniform mixture which comprises:

(a) 100 parts by weight of an alkali-soluble resin as a film-forming agent;

(b) from 5 to 200 parts by weight of a quinonediazido group-containing compound as a photosensitizing agent; and (c) a hydroxyalkyl-substituted pyridine compound represented by the general formula

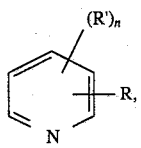

in which R is a hydroxyalkyl group having 1 to 4 carbon atoms, R' is R or an alkyl group having 1 to 4 carbon atoms and the subscript n is 0, 1 or 2, in an amount in the range from 0.1 to 10% by weight based on the total amount of the components (a) and (b).

DETAILED DESCRIPTION OF THE PREFERRED EMBODIMENTS

As is described above, the most characteristic feature of the inventive positive-working photoresist composition consists in the admixture of a specified amount of a specific hydroxyalkyl-substituted pyridine compound of the general formula (I) to a basic photoresist composition consisting of an alkali-soluble resin as the component (a) and a quinonediazido group-containing compound as the component (b), each of which is rather conventional.

The component (a) in the inventive photoresist composition is an alkali-soluble resin which serves as a film-forming agent and can be selected from those conventionally used in the photoresist compositions as a film-forming agent. Examples of suitable alkali-soluble resins include novolac resins as a condensation product of an aromatic hydroxy compound such as phenol, cresol, xylenol and the like with an aldehyde compound such as formaldehyde in the presence of an acid catalyst and poly(hydroxystyrene) as well as derivatives thereof, of which novolac resins are preferred.

The component (b) in the inventive photoresist composition is a quinonediazido group-containing compound which serves as a photosensitizing agent and also can be selected from those used in conventional photoresist compositions. Examples of suitable quinonediazido group-containing compounds include partial or full esterification products between a polyhydroxybenzophenone compound such as 2,3,4-trihydroxybenzophenone and 2,3,4,4'-tetrahydroxybenzophenone with naphthoquinone 1,2-diazide-5- or -4-sulfonic acid as well as nucleus-substituted derivatives thereof such as o-benzoquinone diazide, o-naphthoquinone diazide, o-anthraquinone diazide and o-naphthoquinone diazide sulfonic acid esters and reaction products of an o-quinone diazide sulfonyl chloride with an aromatic compound having a hydroxy group or amino group in the molecule such as phenol, p-methoxyphenol, dimethyl phenols, hydroquinone, bisphenol A, naphthols, pyrocatechol, pyrogallol, pyrogallol monomethyl ether, pyrogallol-1,3-dimethyl ether, gallic acid, partially esterified or etherified gallic acid leaving some of the hydroxy groups, aniline, p-aminodiphenyl amine and the like. These compounds can be used either singly or as a combination of two kinds or more according to need.

The above mentioned partial or full esterification products of a polyhydroxy benzophenone compound as a preferable class of the quinonediazido group-containing compound can be prepared by effecting the condensation reaction of the polyhydroxy benzophenone compound with naphthoquinone-1,2-diazide-5- or -4-sulfonyl chloride in a suitable organic solvent such as dioxane in the presence of an acid acceptor such as triethanolamine, alkali metal carbonates, alkali metal hydrogen carbonates and the like.

The third essential ingredient, i.e. component (c), which is the most characteristic ingredient in the inventive photoresist composition, is a hydroxyalkyl-substituted pyridine compound represented by the above given general formula (I), in which each symbol has the meaning as defined above. Examples of the pyridine compounds suitable as the component (c) include 2-hydroxymethyl pyridine, 3-hydroxymethyl pyridine, 4-hydroxymethyl pyridine, 2-(2-hydroxyethyl) pyridine, 3-(2-hydroxyethyl) pyridine, 4-(2-hydroxyethyl) pyridine, 2-(3-hydroxypropyl) pyridine, 3-(3-hydroxypropyl) pyridine, 4-(3-hydroxypropyl) pyridine, 2,6-di(hydroxymethyl) pyridine, 2-(3-hydroxypropyl)-6-methyl pyridine and the like. These pyridine compounds can be used either singly or as a combination of two kinds or more according to need. Of the above named pyridine compounds, 2-hydroxymethyl pyridine, 2-(2-hydroxyethyl) pyridine and 2-(3-hydroxypropyl) pyridine are particularly preferable and 2-(2-hydroxyethyl) pyridine is most preferable in respect of the good adhesive bonding strength between the resist layer and the substrate surface as well as little degradation in the photosensitivity and film thickness retention in the lapse of time.

In the formulation of the inventive photoresist composition, the amount of the component (b) as the photosensitizing agent is, though not limitative, in the range from 5 to 200 parts by weight or, preferably, from 20 to 100 parts by weight per 100 parts by weight of the component (a). When the amount of the component (b) is too small relative to the component (a), a decrease is caused in the pattern-reproducibility with a decrease in the fidelity of the reproduced pattern to the mask pattern while, when the amount thereof is too large, the uniformity of the resist layer is adversely affected so that resolution of the reproduced pattern is necessarily decreased.

The amount of the component (c) in the inventive photoresist composition is in the range from 0.1 to 10% by weight or, preferably, from 0.5 to 3% by weight based on the total amount of the components (a) and (b). When the amount of the component (c) is too small, the desired improvement cannot be obtained as a matter of course on the adhesive bonding strength of the resist layer to the substrate surface while, when the amount thereof is too large, the stability of the resist composition is adversely affected so that the photosensitivity of the composition and the adhesive bonding strength of the resist layer are gradually decreased during storage of the composition in the lapse of time.

Besides the above described essential ingredients, i.e. components (a), (b) and (c), the inventive photoresist composition can optionally be admixed with various kinds of known additives conventionally used in photoresist compositions including auxiliary resins, plasticizers, stabilizers and the like to improve the film properties of the resist layer, coloring agents to improve the visibility of the patterned resist layer formed by development and photosensitizing aids to enhance the photosensitivity of the resist composition each in a limited amount.

It is a usual and preferable way that the photoresist composition of the invention is used in the form of a uniform solution obtained by dissolving the above described essential and optional ingredients in an organic solvent. Examples of suitable organic solvents include: ketones such as acetone, methyl ethyl ketone, cyclohexanone, methyl isoamyl ketone and 1,1,1-trimethyl acetone; polyhydric alcohols and esteric and etheric derivatives thereof such as ethyleneglycol, diethyleneglycol, propyleneglycol and dipropyleneglycol and monoacetates thereof as well as monomethyl, monoethyl, monopropyl, monobutyl and monophenyl ethers thereof; cyclic ethers such as dioxane and esters such as ethyl lactate, methyl acetate, ethyl acetate, butyl acetate, methyl pyruvate, ethyl pyruvate, methyl 3-methoxypropionate and ethyl 3-ethoxypropionate. These organic solvents can be used either singly or as a mixture of two kinds or more according to need.

Following is a description of a typical procedure of the photolithographic patterning work by using the inventive photoresist composition. Thus, the inventive photoresist composition in the form of a solution as prepared in the above described manner is uniformly applied to the surface of a substrate having a surface layer of silicon oxide, silicon nitride and the like by using a suitable coating machine such as a spinner followed by drying to form a photoresist layer which is pattern-wise exposed through a pattern-bearing photomask to actinic rays such as ultraviolet light emitted from low-pressure, high-pressure and ultrahigh-pressure mercury lamps, arc lamps, xenon lamps and the like to form a latent image of the pattern. Thereafter, the pattern-wise exposed photoresist layer is immersed in a weakly alkaline aqueous solution such as a 1–10% by weight aqueous solution of tetramethylammonium hydroxide as a developer solution so that the resist layer on the exposed areas is selectively dissolved away by the developer solution to expose the substrate surface leaving the resist layer on the unexposed areas to give a patterned resist layer of high fidelity to the mask pattern. The substrate surface thus exposed is subjected to a subsequent treatment such as etching with the patterned resist layer as the etching mask followed by removal of the patterned resist layer, for example, to give an electric circuit pattern.

The positive-working photoresist composition of the invention is particularly useful for the photolithographic patterning works in the manufacture of semiconductor devices, TFTs, liquid crystal display devices and the like by virtue of the advantages of excellent adhesive bonding strength between the resist layer and the substrate surface having a surface layer of silicon oxide or silicon nitride, absence of any sublimates from the additive ingredients in the composition and stability of the composition during storage in respects of the photosensitivity and film thickness retention in development.

In the following, the positive-working photoresist composition of the invention is described in more detail by way of examples, which, however, never limit the scope of the invention in any way. In the examples and comparative examples, the photoresist compositions were subjected to the evaluation tests for the following items each by the testing procedure described there. Adhesive bonding of resist layer:

A glass plate having a surface layer of silicon oxide as a substrate was uniformly coated with the photoresist composition on a spinner in a coating thickness of 1.6 μm as dried followed by a pre-baking treatment on a hot plate at 110° C. for 90 seconds to form a resist layer which was contact-exposed to ultraviolet light through a test-pattern photomask on an exposure machine (Model PLA-500F, manufactured by Canon Co.).

The pattern-wise exposed resist layer on the substrate plate was immersed in a 2.38% by weight aqueous solution of tetramethylammonium hydroxide at 23° C. for 65 seconds so that the resist layer on the exposed areas was dissolved away leaving a patterned resist layer having a line width of 10 μm on the surface layer of silicon oxide followed by a post-baking treatment on a hot plate at 120° C. for 5 minutes. With the thus formed line-patterned resist layer as an etching resist, the silicon oxide layer was subjected to an etching treatment by dipping for 10 minutes in an etching solution which was a 7% by weight aqueous solution of 1:6 by weight mixture of hydrofluoric acid and ammonium fluoride as a high-purity buffered hydrofluoric acid (a product by Hashimoto Kasei Co.). The patterned resist layer after this etching treatment was examined with an electron microscope to measure the width of the silicon oxide line left after the etching treatment in μm. Records were made of the decrement of this line width of the silicon oxide layer from 10 μm, which was the line width of the resist pattern in four ratings of A, B, C and D for the decrement not exceeding 3 μm, larger than 3 μm but not exceeding 5 μm, larger than 5 μm but not exceeding 7 μm and larger than 7 μm, respectively. Sublimation:

The procedure described above for the preparation of a patterned resist layer on a substrate down to the step of post-baking treatment was repeatedly undertaken 200 times in a treatment chamber and the results were recorded as Poor or Good when sublimates were found or not found, respectively, on the walls of the chamber. Instability of photosensitivity by storage:

Photosensitivity of the photoresist composition was measured in the following manner with a freshly prepared composition and that after storage at 40° C. for 2 weeks in a dark brown glass bottle under hermetic sealing.

Thus, patterning tests were undertaken in just the same manner as in the test for adhesive bonding described above except that the exposure time on the contact-exposure machine (Model PLA-500F, supra) was varied stepwise starting from 0.1 second with increments of each 0.01 second to determine the minimum exposure time by which an exact reproduction could be obtained for a line pattern having a width of 10 μm. This minimum exposure time was larger for the photoresist composition after storage than for the same but fresh composition so that the ratio of this increase in this minimum exposure time to the time for the fresh composition in % was recorded as a measure for the instability of the composition by storage. Instability of film thickness retention by storage:

The film thickness retention, which is the ratio of the residual film thickness on the unexposed areas after development to the film thickness of the layer on the same areas before development, was determined for the fresh photoresist composition and that after storage at 40° C. for 2 weeks in a hermetically sealed brown glass bottle. The film thickness retention was smaller with the composition after storage than with the fresh composition so that the ratio of the decrement in the film thickness retention by storage to the value with the fresh composition in % was recorded as a measure of instability of the composition by storage relative to the film thickness retention.

Example 1.

A photoresist composition was prepared by dissolving, in a mixture of 360 parts by weight of ethyl lactate and 40 parts by weight of butyl acetate, 100 parts by weight of a cresol novolac resin having a weight-average molecular weight of 5,000 prepared by the condensation reaction of a 60:40 by moles mixture of m- and p-cresols with formaldehyde in the presence of oxalic acid as the catalyst, 25 parts by weight of an esterification product of 1 mole of 2,3,4,4'-tetrahydroxy benzophenone and 2.5 moles of naphthoquinone-1,2-diazide-5-sulfonyl chloride and 1.25 parts by weight of 2-(2-hydroxyethyl) pyridine followed by filtration through a membrane filter having a pore diameter of 0.2 μm.

The results of the evaluation tests for this photoresist composition are shown in Table 1.

Example 2.

The formulation of the photoresist composition and the experimental procedure was substantially the same as in Example 1 excepting replacement of 1.25 parts by weight of 2-(2-hydroxyethyl) pyridine with the same amount of 2-(3-hydroxypropyl) pyridine.

The results of the evaluation tests for this photoresist composition are shown in Table 1.

Comparative Examples 1 to 3.

The formulation of the photoresist composition and the experimental procedures in each of Comparative Examples 1, 2 and 3 were substantially the same as in Example 1 excepting replacement of 1.25 parts by weight of 2-(2-hydroxyethyl) pyridine with 1.0 part by weight of benzimidazole, 1.25 parts by weight of N,N-diethyl aniline and 1.25 parts by weight of triethyl amine, respectively.

The results of the evaluation tests for these photoresist compositions are shown in Table 1.

TABLE 1

| | Adhesive bonding | Sublimation | Instability of photo-sensitivity, % | Instability of film thickness retention, % |
| --- | --- | --- | --- | --- |
| Example 1 | A | Good | 3 | 5 |
| Example 2 | A | Good | 5 | 8 |
| Comparative Example 1 | A | Poor | 20 | 25 |
| Comparative Example 2 | A | Good | 32 | 38 |
| Comparative Example 3 | A | Good | 48 | 50 |

What is claimed is:

1. A positive-working photoresist composition which comprises, as a uniform mixture:

(a) 100 parts by weight of an alkali-soluble resin as a film-forming agent;

(b) from 5 to 200 parts by weight of a quinonediazido group-containing compound as a photosensitizing agent; and (c) a hydroxyalkyl-substituted pyridine compound represented by the general formula

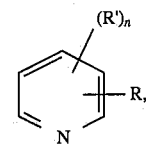

in which R is a hydroxyalkyl group having 1 to 4 carbon atoms, R' is R or an alkyl group having 1 to 4 carbon atoms and the subscript n is 0, 1 or 2, in an amount in the range from 0.1 to 10% by weight based on the total amount of the components (a) and (b).

2. The positive-working photoresist composition as claimed in claim 1 in which the pyridine compound as the component (c) is selected from the group consisting of 2-hydroxymethyl pyridine, 3-hydroxymethyl pyridine, 4-hydroxymethyl pyridine, 2-hydroxyethyl pyridine, 3-hydroxyethyl pyridine, 4-hydroxy-ethyl pyridine, 2-hydroxypropyl pyridine, 3-hydroxypropyl pyridine, 4-hydroxypropyl pyridine, 2,6-dihydroxymethyl pyridine and 2-hydroxypropyl-6-methyl pyridine.

3. The positive-working photoresist composition as claimed in claim 2 in which the pyridine compound as the component (c) is selected from the group consisting of 2-hydroxymethyl pyridine, 2-hydroxyethyl pyridine and 2-hydroxypropyl pyridine.

4. The positive-working photoresist composition as claimed in claim 1 in which the amount of the component (b) is in the range from 20 to 100 parts by weight per 100 parts by weight of the component (a).

5. The positive-working photoresist composition as claimed in claim 1 in which the amount of the component (c) is in the range from 0.5 to 3% by weight based on the total amount of the components (a) and (b).

* * * * *